US012628481B2

(12) United States Patent
Zrinscak

(10) Patent No.: US 12,628,481 B2
(45) Date of Patent: May 12, 2026

(54) DIODE ARRANGEMENT

(71) Applicant: AZUR SPACE Solar Power GmbH,
Heilbronn (DE)

(72) Inventor: Ivica Zrinscak, Heilbronn (DE)

(73) Assignee: Azur Space Solar Power GmbH,
Heilbronn (DE)

( * ) Notice: Subject to any disclaimer, the term of this
patent is extended or adjusted under 35
U.S.C. 154(b) by 396 days.

(21) Appl. No.: 18/518,697

(22) Filed: Nov. 24, 2023

(65) Prior Publication Data

US 2024/0170582 A1    May 23, 2024

(30) Foreign Application Priority Data

Nov. 23, 2022    (DE) ..................... 10 2022 004 377.7

(51) Int. Cl.
H10H 20/857        (2025.01)
H10D 8/00          (2025.01)
H10W 70/40         (2026.01)
(52) U.S. Cl.
CPC ........... H10H 20/857 (2025.01); H10D 8/411
(2025.01); H10W 70/421 (2026.01)
(58) Field of Classification Search
None
See application file for complete search history.

(56) References Cited

U.S. PATENT DOCUMENTS 4,994,412  A     2/1991  Kalfus et al.
6,317,327  B1   11/2001  Lin 7,285,846  B1 *  10/2007  Tran ..................... H10W 70/481
                                                257/667
10,297,535  B2    5/2019  Qin et al.
2022/0384663  A1  12/2022  Matsubara et al.

FOREIGN PATENT DOCUMENTS

CA              973975        9/1975
DE            2 248 089       4/1973
DE     10 2006 052 118 A1    5/2008
JP          2004289103 A     10/2004
JP          2012-129219 A     7/2012
WO        WO2021157720 A1     8/2021

* cited by examiner

*Primary Examiner* — Feifei Yeung Lopez
(74) *Attorney, Agent, or Firm* — Muncy, Geissler, Olds &
Lowe, P.C.

(57)            ABSTRACT

A diode arrangement, including a semiconductor diode with
a p/n junction. A first electrical contact is formed on an upper
side and a second electrical contact is formed on an under-
side. The semiconductor being designed in an uncased
manner as a flat die and having a planar upper side and a
planar underside, and the metal-plated upper side forming
the first contact of the semiconductor diode, and the metal-
plated underside forming the second contact. A first flat
metallic conductor has a first contact surface and a second
contact surface spaced a distance apart from the first contact
surface by a connecting piece. A second flat metallic con-
nector has a first contact surface and a second contact
surface spaced a distance from the first contact surface by a
connecting piece. The metal-plated upper side is connected
in a materially bonded manner to the first contact surface of
the first metallic connector.

15 Claims, 7 Drawing Sheets

VBS
KF1        KF2

A                    A'

VB11

A - A'        VB11

VBS        VB12

VB12    VBS
KF1

H1        B - B'

KF2

VBS

KF1        KF2

SL

VB13

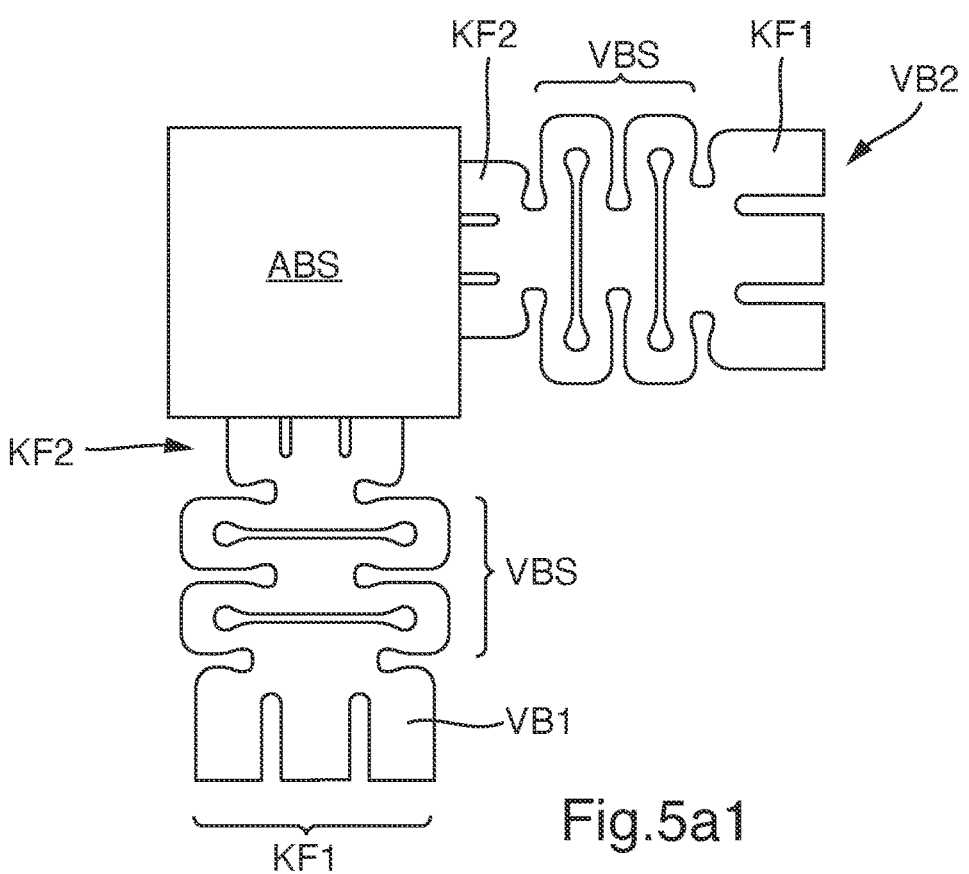
Fig.5a1
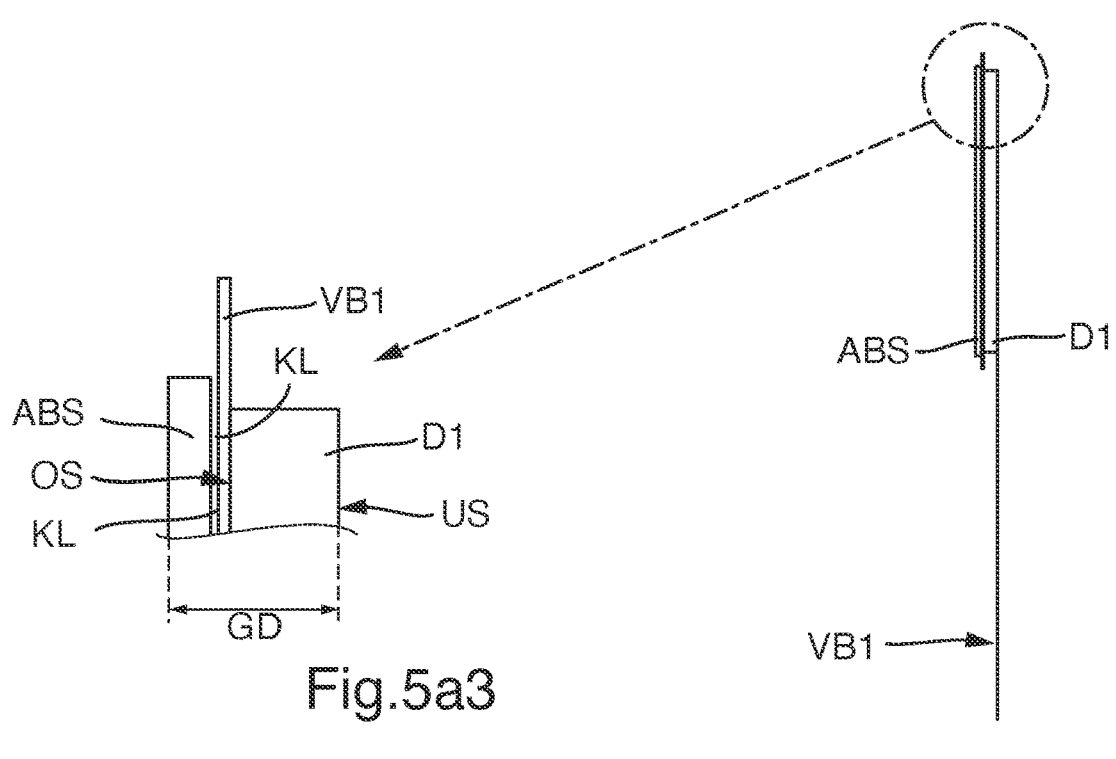
Fig.5a3
Fig.5a2

DIODE ARRANGEMENT

This nonprovisional application claims priority under 35 U.S.C. § 119(a) to German Patent Application No. 10 2022 004 377.7, which was filed in Germany on Nov. 23, 2022, and which is herein incorporated by reference.

BACKGROUND OF THE INVENTION

Description of the Background Art

Diode arrangements have been used in large numbers for many decades in both integrated and discrete specific embodiments for the purpose of protecting circuits and/or protecting motors and controllers and/or for protecting batteries. In particular, diodes of this type are used for so-called polarity reversal protection.

SUMMARY OF THE INVENTION

It is therefore an object of the invention is to provide a device which refines the prior art.

According to an example of the device, a diode arrangement is provided as an uncased finished product, which includes a semiconductor diode having exactly one p/n junction.

The semiconductor diode has a p-doped upper side and an n-doped underside or an n-doped upper side and a p-doped underside.

A first electrical contact is formed on the upper side and a second electrical contact is formed on the underside.

The uncased semiconductor diode is designed as a discrete component and as a planar die.

The semiconductor diode furthermore has a planar upper side and a planar underside, the surface area of the upper side and the surface area of the underside being completely or at least more than 80% or more than 90% metal-plated.

The surface area on the underside and/or the upper side may not be 100% metal-plated. A circumferential region on the boundary or on the edge is not metal-plated to avoid short-circuits between the upper surface and side surface. During the manufacture of the semiconductor wafer, in particular, a separation of the multiplicity of diodes is usually carried out with the aid of a sawing process. A smearing of metal along the side surface is prevented with the aid of the circumferential metal-free region on the edge.

The predominantly metal-plated upper side forms the first contact and the metal-plated underside forms the second contact of the semiconductor diode.

The first contact is designed as a cathode and the second contact as an anode, or the first contact is designed as an anode and the second contact as a cathode.

In addition, a first flat metallic connector is provided, which has a first contact surface and a second contact surface situated at a distance from the first contact surface by a connecting piece.

A second flat metallic connector is furthermore provided, which has a first contact surface and a second contact surface situated at a distance from the first contact surface by a connecting piece.

The connecting piece does not protrude, or by no more than 1.5 mm or 2.5 mm, from a plane determined by the first contact surface and/or by the second contact surface.

It should be noted that the connector is provided as a whole with a planar design in the example, in which the connecting piece does not protrude from a plane determined by the first contact surface and by the second contact surface.

The metal-plated upper side is also connected to one of the two contact surfaces in a materially bonded manner, i.e., to the first contact surface or to the second contact surface of the first metallic connector. The surface portion covered by the particular contact surface of the connector is between 5% and 90% or between 10% and 30% of the entire surface area of the particular contact of the semiconductor diode. In other words, at least 5% and no more than 90% or at least 10% and no more than 30% of the metal layer on the upper side or on the underside of the semiconductor diode has a materially bonded connection to one of the two connectors.

It is understood that a soldering process or a welding process can be carried out to form the materially bonded connection between the particular contact surface of the semiconductor diode and the particular contact surface of the connectors.

The metal-plated underside can be connected to one of the two contact surfaces in a materially bonded manner, i.e., to the first contact surface or to the second contact surface of the second metallic connector.

The contact surfaces can be electrically connected to the upper side or to the lower side in the known manner. In particular, the materially bonded connection is effectuated with the aid of a soldered joint or a welded joint.

The semiconductor diode can include a p-doped semiconductor layer and an n-doped semiconductor layer. The two semiconductor layers are formed over the entire surface and border each other. It should be noted that the semiconductor diodes each have exactly one p/n junction.

The doping of the semiconductor layers can be on the upper side and on the underside for the purpose of reducing in each case the connection resistance, i.e., the contact resistance, above $1 \cdot 10^{18}/\text{cm}^3$.

The particular uncased semiconductor diodes may not have any casting compound. Instead the semiconductor diode are so-called "bare die" designs.

An advantage of the diode arrangement is that an ultra-flat and compact arrangement is provided, which reliably removes the heat via the connectors even in the case of currents above 1 ampere. A further advantage is that the metal-plating covering the entire surface reliably protects the semiconductor diode against environmental influences such as light and improves the removal of heat.

Another advantage is that a cost-effective and reliable, discrete component may be manufactured. A thermally insulating housing is omitted.

A further advantage is that the diode arrangement may be designed to be easily and effectively handled for a further processing.

In an example, exactly one first contact is formed on the upper side. In other words, the entire upper side is made up of the first contact.

In an example, exactly one single second contact is formed on the underside of the die regardless of the size.

Multiple first contacts arranged side by side can be formed on the upper side, two directly adjacent first contacts being electrically isolated from each other in each case with the aid of a mesa trench. It is understood that the depth of the mesa trench can be designed in such a way that at least the p/n junction is cut through.

A single second contact can be furthermore formed on the underside. Multiple individual diodes may also be easily connected in parallel by forming multiple first contacts and only one single second contact. A parallel connection of multiple individual diodes makes it possible to reduce the resistance and the heating of the diode and to increase the reliability of the diode arrangement, in particular when using the diode arrangement as a protective structure.

In an example, exactly two first contacts are electrically connected to a single connector.

In an example, the multiple first contacts can be arranged in exactly one row or in exactly two rows. Along one row, exactly three first contacts or six first contacts are arranged along two rows formed in parallel to each other, corresponding to a 2×3 matrix.

An advantage is that, if a defect occurs in a region of the first contacts in the case of multiple first contacts on a die, another region may be electrically connected to another first contact. In other words, the die may be reused and the yield further increased.

Moreover, in the case of larger metal surfaces, the heat removal may also be increased without additional cooling bodies the larger the die, i.e., the more first contacts being formed. Six individual first contacts are formed on the front side.

In an example, a cover glass is arranged on the upper side or on the underside, a layer of adhesive being arranged between the cover glass and the contact surface. It is understood that the upper side or the underside is at least partially covered with adhesive in a materially bonded manner. At least a portion of the first contact surface or the second contact surface is also preferably covered by the adhesive.

In an example, the thickness of the cover glass can be in a range between 50 μm and 500 μm, preferably between 60 μm and 300 μm.

In an example, the cover glass can be exactly the same size as the surface of the die or the upper side.

The adhesive can be formed between the cover glass and the connector or the upper side or the underside. No adhesive is preferably formed above the central piece of the connector.

The adhesive and the cover glass can be designed to be transparent in the visible spectral range and in the ultraviolet spectral range. A large portion of the sunlight emitted through the cover glass may be reflected hereby.

In an example, only a circumferential narrow region on the particular edge is not metal-plated on the underside and on the upper side in each case.

In an example, it is understood that the non-metal-plated regions along the edge of the upper side or the non-metal-plated regions along the edge of the underside can have a passivation.

In an example, the passivation, which is preferably provided with a layered design, comprises an oxide and a nitride layer.

In an example, the metal layers on the underside or on the upper side each extend continuously from the highly doped semiconductor contact regions directly on the upper side or on the underside up to the passivation. In other words, the region up to the passivation, i.e., the outer boundary of the metal layers, is formed exclusively on the passivation layer in this case.

The upper side and/or the underside of the semiconductor diode can have a surface area between 0.01 cm² and 4 cm² or a surface area between 0.05 cm² and 0.5 cm². It is understood that the current-carrying capacity of the diode arrangement is increased by a larger surface area.

The current-carrying capacity of the entire diode arrangement can be configured for no more than 2 A or for no more than 5 A or for no more than 10 A or for 20 A.

The semiconductor diodes can be designed to be quadrilateral, i.e., square or rectangular.

The two second contact surfaces of the connector can be arranged opposite each other in a first approximation along a line or exactly along a line, or the two second contact surfaces are arranged at right angles in a first approximation or exactly at right angles to each other. One advantage of the two arrangements is that a short-circuit between the anode and cathode may be effectively avoided.

The two contact surfaces of the connector can each be provided with a planar design.

The connectors can be made from a metal or a metallic compound. The connectors preferably each can have a uniform material, i.e., the two contact surfaces and the connecting piece are made from the same material.

The thickness of the material of the particular connectors can be in a range between 0.01 mm and 1.2 mm. The thickness of the material of the particular connector is preferably in a range between 0.04 mm and 0.3 mm.

The first connector can be shaped identically or identically in a first approximation to the second connector, or the first connector has a different shape than the second connector. The connectors are preferably equivalent parts to simplify the handling and to reduce the cost of manufacturing and further processing.

The second connector can be connected to an upper side or an underside of a further semiconductor diode. In the case of the further semiconductor diode, the underside or the upper side is also connected to a first contact surface or to one of the two contact surfaces of the third connector, so that the two semiconductor diodes are connected in series.

The current-carrying capacity can be increased by a parallel circuit and the voltage resistance can be increased by a series circuit.

The connecting piece comprises meander-shaped metal strips between the first contact surface and the second contact surface, or the connecting piece can be made up of meander-shaped metal strips, the metal strips preferably being arranged in parallel to each other. A mechanical decoupling and/or thermal decoupling between the first contact surface and the second contact surface may be increased with the aid of the meander-shaped arrangement.

The first contact surface and/or the second contact surface can be at least partially provided with a fork-shaped design and has exactly one lug piece or exactly two lug pieces or at least or exactly three lug pieces, and the multiple lug pieces are designed to be spaced a distance apart and in parallel to each other.

The shear stress with temperature fluctuations caused by different coefficients of expansion between the semiconductor diode and the contact surfaces may be reduced with the aid of the fork-shaped design.

The first contact surface of the first connector can simultaneously contact two semiconductor diodes situated side by side.

The arrangement of connectors and semiconductor diodes can have a thickness between 0.03 mm and 1.5 mm or between 0.1 mm and 0.5 mm.

The semiconductor diodes can be covered completely and by at least parts of one or both connectors. The covering preferably comprises organic and inorganic materials. The upper side and/or the underside may be protected against environmental influences with the aid of the covering.

The covering can be provided with a plate-shaped design and connected to the upper side and/or the underside with the aid of an adhesive or with the aid of an adhesive layer. The covering and the adhesive layer are made from different materials. The adhesive layer comprises or is made up of organic materials. The adhesive layer and the cover layer preferably have a total thickness between 40 μm and 500 μm or between 80 μm and 200 μm.

The connectors and the semiconductor diodes can be arranged in a plane or approximately in a plane.

The connectors can each have planar contact surfaces.

The connector between the first contact surface and the second contact surface can have a slight offset, so that the two contact surfaces are formed in different planes.

The offset in the connectors can be formed between one of the two contact surfaces and the connecting piece.

The offset in a first approximately can correspond to the thickness of the semiconductor diode. In other words, the offset, i.e., the distance between the two planes of the two contact surfaces of the particular connector in the direction of the perpendiculars of the two planes, is greater than 0.1 mm and less than 1.5 mm.

The semiconductor diode can be designed as a silicon diode.

The semiconductor diode can have a thickness between 50 μm and 600 μm.

The reverse voltage of the semiconductor diode can be in a range between 20 V and 800 V. The reverse voltage is preferably in a range between 100 V and 300 V.

The portion of the surface area of the first contact and/or the second contact in which a materially bonded connection to one of the two contact surfaces is formed can be between 5% and 90% of the particular total surface area of the two contacts, i.e., the metal layer on the upper side and on the underside of the semiconductor diode is connected to the connectors over a wide area. A low-resistance electrical connection may be achieved hereby.

The two connectors can be designed as planar or nearly planar equivalent parts.

The particular connectors can be formed in a mirror-symmetrical manner along a line perpendicular to the long side of the connector. In an example, the connectors or at least one of the connectors do/does not have a mirror symmetry.

The connectors can be designed to be different from each other.

At least one of the connectors or all connectors can have a step along the long side.

The height of the step can be smaller by a factor of 20 than the extension of the connector along the long side.

The connectors can be designed as flat or nearly flat metal lugs and have a thickness between 50 μm and 500 μm or between 80 μm and 200 μm.

The ratio between a length of the connectors and their width can be in a range between 3 to 10. The connectors preferably can have a width between 0.5 cm and 3 cm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1b shows a side view along section line A-A' in the example illustrated in connection with FIG. 1a;

FIG. 2b shows a side view of the example in FIG. 2a;

FIG. 3a shows a top view of an example of a connector;

FIG. 3b shows a side view of the example in FIG. 3a;

FIG. 5a1 shows a front view of a diode arrangement, including a semiconductor diode, and including a cover, and including two connectors;

FIG. 5a2 shows a side view of the example illustrated in FIG. 5a1;

FIG. 5a3 shows an enlarged detail of a portion of the side view illustrated in FIG. 5a2;

FIG. 5b shows a rear view of the example illustrated in FIG. 5a;

FIG. 5c shows a perspective view of the example illustrated in FIG. 5a;

FIG. 6a shows a front view of a diode arrangement, comprising a series circuit of two diodes, each including a covering and multiple connectors;

FIG. 6b shows a side view of the example illustrated in FIG. 6a;

FIG. 6c shows a rear view of the example illustrated in FIG. 6a;

DETAILED DESCRIPTION

In the following examples of the diode arrangement, some of diodes are designed as semiconductor diodes without cases and, in particular, do not have any casting compound. Instead they are so-called "bare die" designs. The semiconductor diodes are designed to be quadrilateral, generally either square or rectangular.

Figure 1A:
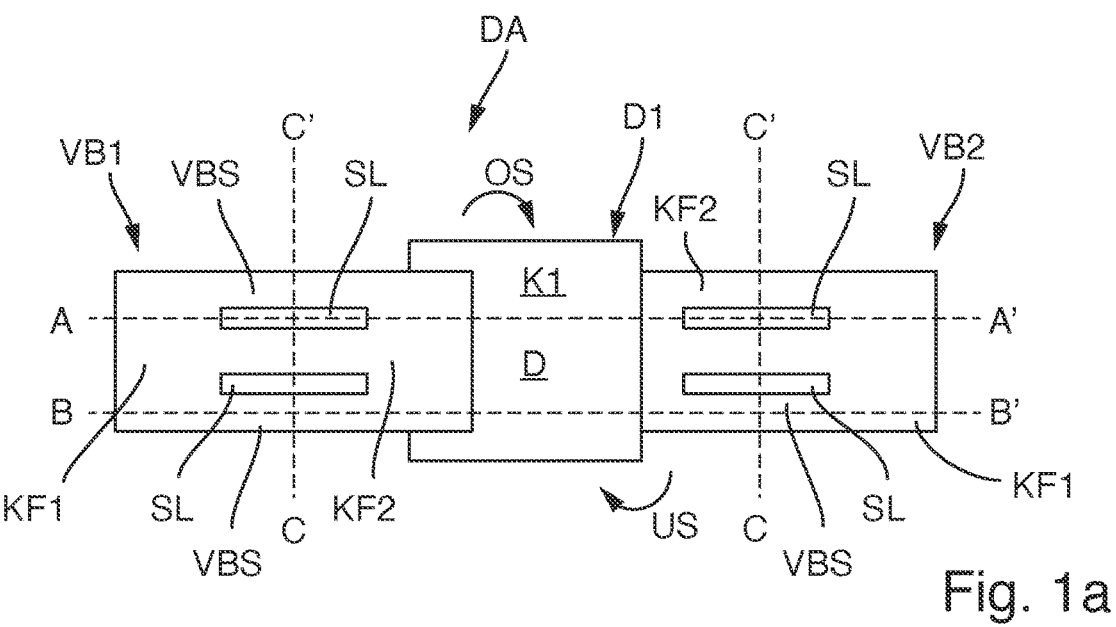
FIG. 1a shows a front view of a diode arrangement, including a semiconductor diode and including two connectors and having two section lines A-A' and B-B'.

The illustration in FIG. 1a shows a front view of a diode arrangement DA, including a semiconductor diode D1 and including two connectors VB1 and having two section lines A-A' and B-B'.

Semiconductor diode D1 has a first semiconductor region with a doping of a first type extending from an upper side OS in the direction of an underside US and a second semiconductor region with a doping of a second type extending from underside US in the direction of upper side OS. Exactly one p/n junction is formed hereby.

It is understood that the first type is designed as a p doping and the second type as an n doping, or the first type is designed as an n doping and the second type as a p doping.

A first electrical contact K1 is formed on upper side OS and a second electrical contact K2 is formed on underside US.

Semiconductor diode D1 is designed as a discrete component, uncased as a flat die D. Upper side OS and underside US are each designed to be planar and in parallel to each other.

First contact K1 and second contact K2 are each designed as a metal layer, the metal layer in the present case covering more than 80% of the total surface area of upper side OS and more than 80% of the total surface area of underside US.

In other words, nearly the entire surface area of underside IS is metal-plated, and nearly the entire surface area of upper side OS is metal-plated.

In addition, diode arrangement DA comprises a first metallic connector VB1. First connector VB1 is designed to be flat, i.e. planar or at least planar in a first approximation, and has a first contact surface KF1 and a second contact surface KF2, which is spaced a distance apart from first contact surface KF1 by a connecting piece VBS.

The diode arrangement furthermore includes a second metallic connector VB2, second connector VB2 is designed to be flat, i.e. planar or at least planar in a first approximation, and has a first contact surface KF1 and a second contact surface KF2, which is spaced a distance apart from first contact surface KF1 by a connecting piece VBS.

First connector VB1 and second connector VB2 have two slot-shaped recesses SL in the region of connecting piece VBS.

First contact K1, i.e. the metal layer on upper side OS of semiconductor diode D [sic; D1], is connected in a materially bonded manner to second contact surface K2 of first metallic connector VB1.

Second contact K2, i.e. the metal layer on underside US of semiconductor diode D1, is furthermore connected to first contact surface KF2 of second metallic connector VB2.

In the present case, the portion of the surface area of first contact K1 and/or second contact K2, in which a materially bonded connection is formed with one of the two contact surfaces KF1 and KF2, is in a range between 5% and 90% of the particular total surface area of the two contacts K1, K2.

The two connectors VB1, VB2 are designed as planar equivalent parts and formed in a mirror-symmetrical manner along a line C-C', which runs perpendicularly to the long side of the particular connector.

In an example, the two connectors VB1, VB2 are designed to be different from each other. In another example, particular connectors VB1, VB2 do not have a mirror symmetry formed along line C-C'.

Connectors VB1, VB2 are each designed as flat metal lugs and have a thickness is in a range between 50 μm and 500 μm. In an example, at least one of the connectors or all connectors VB1, VB2 have a step along the long side. The height of the step is smaller by at least a factor of 20 than the extension of connector VB1, VB2 along the long side.

Figure 1B:
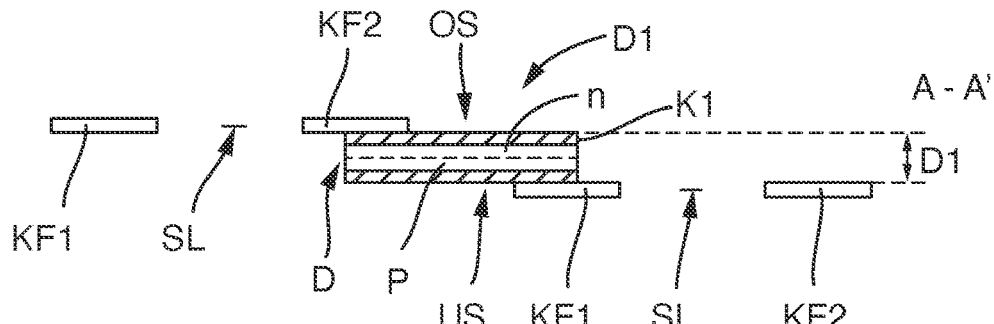

The illustration in FIG. 1b shows a side view along section line A-A' in the example, illustrated in connection with FIG. 1a. Only the differences from the illustration in FIG. 1a are explained below.

In the case of first connector VB1 and in the case of second connector VB2, first contact surface KF1 in each case is separated from second contact surface KF2 by slot-shaped recess SL.

Second contact surface KF2 of first connector VB1 is connected in a materially bonded manner to first contact K1 on upper side OS of semiconductor diode D1. In addition, first contact surface KF1 of second connector VB2 is connected in a materially bonded manner to second contact K2 on underside US of semiconductor diode D1. The materially bonded connections are preferably established with the aid of a soldering process or a welding process.

Semiconductor diode D1 is provided with a planar design and has a thickness HD in a range between 50 μm and 500 μm.

The metal layer of first contact K1 covers entire upper side OS, while the metal layer of the second contact covers the entire underside. In the interest of clarity, the fact that the metal layer on upper side OS and on underside US is not formed up to an area directly at the particular edge of semiconductor diode D1 on upper side OS and on underside US is not illustrated.

In the present case, semiconductor diode D1 has an n-doped region on upper side OS and a p-doped region on underside US. The p/n junction is sketched in the present case by the dashed line between the two regions.

Figure 1C:
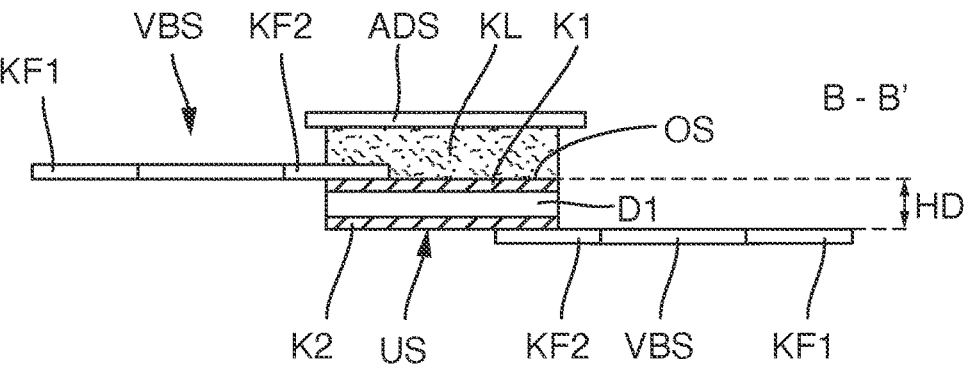
FIG. 1c shows a side view along section line B-B' in the specific example illustrated in connection with FIG. 1a, an adhesive layer with a covering being arranged on the front side.

The illustration in FIG. 1c shows a side view along section line B-B' in the example, illustrated in connection with FIG. 1a, an adhesive layer KL with a covering ADS being arranged on the front side. Only the differences from the preceding example, shown in FIG. 1a or FIG. 1b are explained below.

On upper side OS of semiconductor diode D1, the portion of second contact surface KF2 connected to first contact K1 and the remaining surface area of upper side OS are covered by adhesive layer KL. Covering ADS is arranged above adhesive layer KL, adhesive layer KL connecting covering ADS to semiconductor diode D1. Covering ADS and adhesive layer KL are made from different materials. Adhesive layer KL comprises or is made up of organic materials.

Covering ADS is designed as a thin wafer having a thickness between 30 μm and 150 μm and protects upper side OS against environmental influences.

Figure 2A:
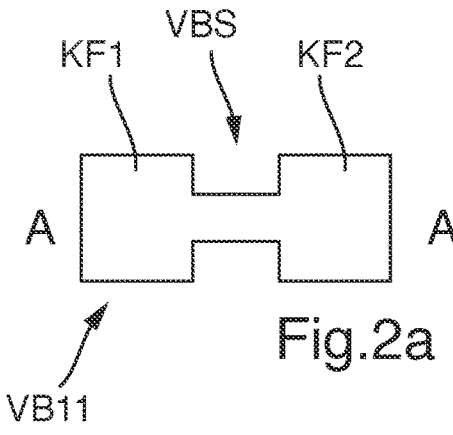
FIG. 2a shows a top view of an example of a connector.
Figure 2B:
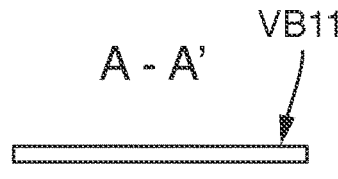

The illustration in FIG. 2a shows a top view of a second example of connector VB1, VB2, the illustration in FIG. 2b showing a side view of the example in FIG. 2a. Only the differences between the second example of connector VB1, VB2 and the preceding example are explained below.

Connecting piece VBS has a smaller width than the two contact surfaces KF1, KF2. In addition, no slots SL are formed in the region of connecting piece VBS.

Figure 3B:
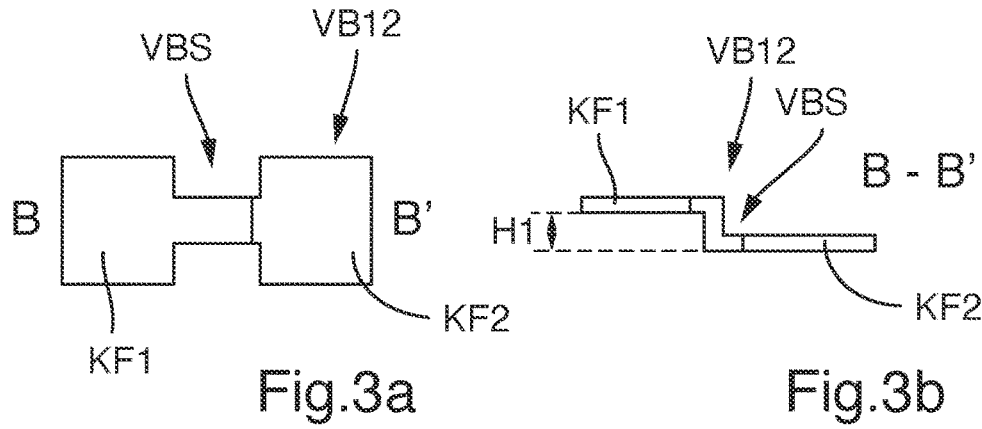

The illustration in FIG. 3a shows a top view of a third example of connector VB1, VB2, the illustration in FIG. 3b showing a side view of the example in FIG. 3a. Only the differences between the third example of connector VB1, VB2 and the preceding examples are explained below.

A step having a height H1 is now formed between first contact surface KF1 and second contact surface KF2 in the region of connecting piece VBS.

Height H1 of the step is preferably in a range between 200 μm and 800 μm. Except for the step, contact surfaces KF1, KF2 are provided with a planar design, as in the preceding examples.

Figure 4:
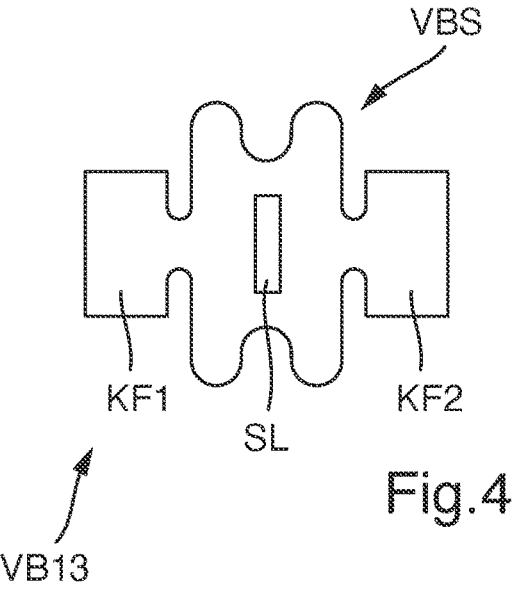
FIG. 4 shows a top view of an example of a connector.

The illustration in FIG. 4 shows a top view of a fourth example of connector VB1, VB2. Only the differences between the fourth example of connector VB1, VB2 and the preceding examples are explained below.

Connecting piece VBS has a meander-shaped profile with a varying width. In the region of connecting piece VBS, a slot SL is formed perpendicularly to the long side of connector VB1, VB2, connector VB1, VB2 being provided with a planar design overall, i.e. without a step.

The illustration in FIG. 5a1 shows a top view of a diode arrangement DA, including a semiconductor diode D1 beneath covering ABS and two connectors VB1, VB2. The illustration in FIG. 5a2 shows a side view of the example illustrated in FIG. 5a1, and the illustration in FIG. 5a3 shows an enlarged detail of a portion of the side view illustrated in FIG. 5a2.

Only the differences between the example and diode arrangement DA in FIGS. 1a and 1b are explained below. In the interest of clarity, the metal layers and first contact K1 on the upper side and second contact K2 on lower side US are not drawn.

Covering ABS is arranged on upper side OS of semiconductor diode D1, covering ABS projecting slightly over semiconductor diode D1 on all sides. First connector VB1 and second connector VB2 are designed as equivalent parts, in contrast to the preceding examples, first contact surface KF1 and second contact surface KF2 each having three tine-shaped formations instead of one continuous contact surface.

In addition, the width of first contact surface KF1 is greater in each case than the width of second contact surface KF2. In the case of the two connectors VB1, VB2, second contact surface KF2 is connected in each case to one of the two contacts K1, K2 of semiconductor diode D1.

In the case of connectors VB1, VB2, each connecting piece VBS is provided with a meander-shaped design to thermally and mechanically decouple the two contact surfaces KF1, KF2 from each other.

The long sides of connectors VB1, VB2 have an angle of 90° to each other, i.e., connectors VB1, VB2 are arranged at right angles to each other.

Total thickness GD of the arrangement made up of covering ABS, adhesive layer KL, second contact surface KF2, and semiconductor diode D2 is less than 1.6 mm.

Figure 5B:
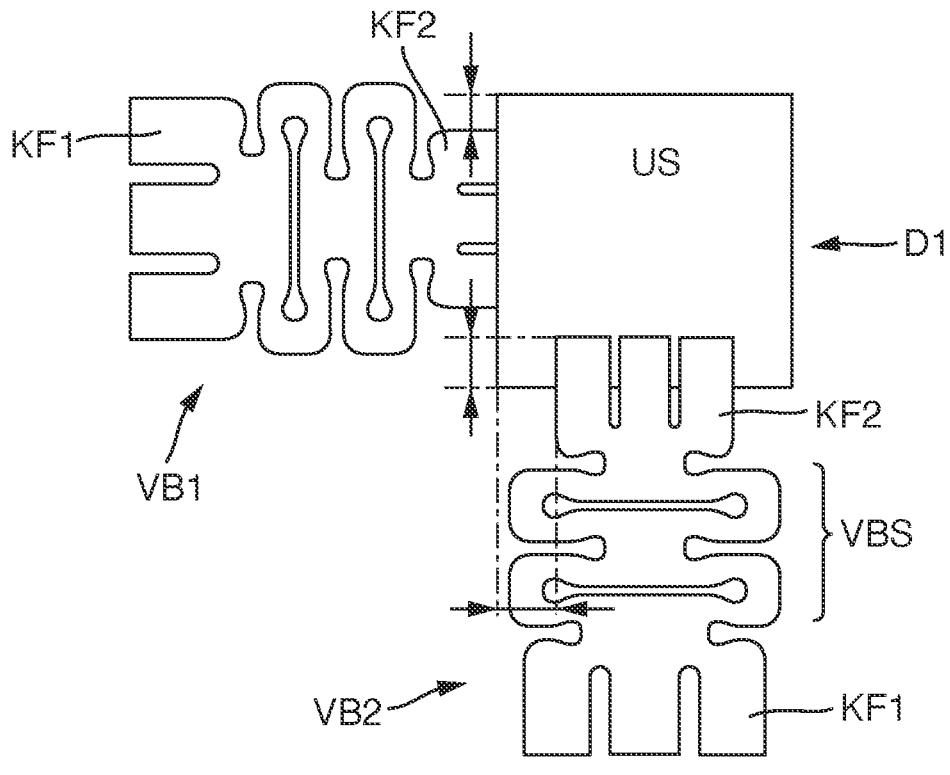
Figure 5C:
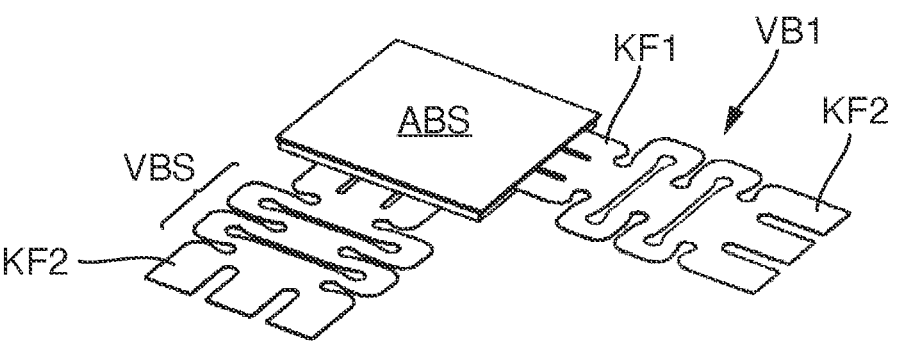

The illustration in FIG. 5b shows a rear view of the example shown in FIG. 5a, the illustration in FIG. 5c depicting a perspective view of the example shown in FIG. 5a. Only the differences between the example of diode arrangement DA in FIGS. 5a1 through 5a3 are explained below.

All three tine-shaped versions of second contact surface KF2 of second connector VB2 are connected to second contact K2 on underside US of semiconductor diode D1.

In contrast to upper side OS of semiconductor diode D1, underside US of semiconductor diode D1 is not covered, i.e., it does not have a covering ABS.

Figures 6A, 6B:
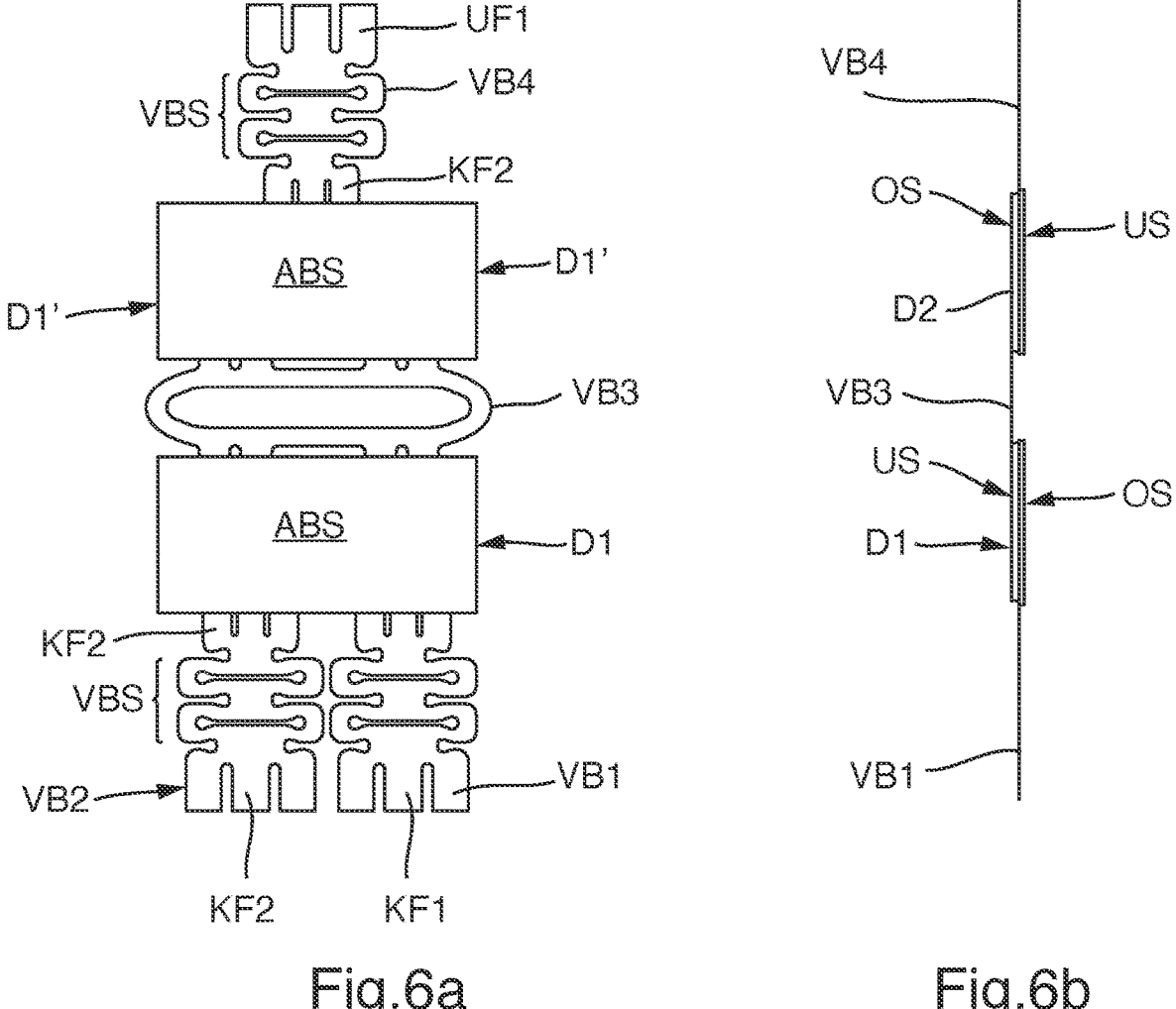
Figure 6C:
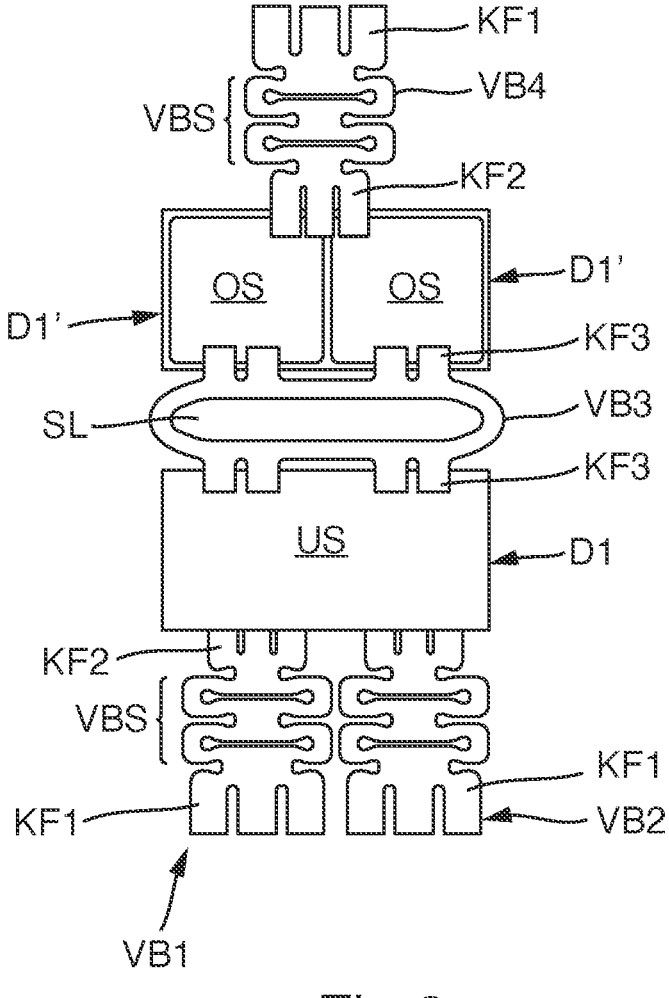

The illustration in FIG. 6a shows a front view of a diode arrangement DA, comprising a series circuit in connection with a parallel circuit of a total of three semiconductor diodes D1, D1', each having a cover ABS and multiple connectors VB1, VB2, VB3, the illustration in FIG. 6b depicting a side view and the illustration in FIG. 6c a rear view of the example shown in FIG. 6a.

Only the differences from the preceding diode arrangements DA in FIGS. 5a1 through 5c are explained below.

Semiconductor diode D1 is now provided with a rectangular and not a square design and also has a covering ABS on upper side OS. Upper side OS, i.e. first contact K1, is connected in parallel with the aid of second contact surfaces KF2 of first connector VB1 and second connector VB2. The current-carrying capacity or reliability of the electrical connection increases hereby.

Underside US of semiconductor diode D1 is connected by a third contact surface KF3 of a third connector VB3. Third connector VB3 has a different shape than the two connectors VB1, VB2.

The upper side of two further semiconductor diodes D1' connected in parallel to each other are connected with the aid of further third contact surface KF3. For this purpose, the two square semiconductor diodes D1' are arranged with upper side OS facing downward, i.e., rotated.

In other words, upper side OS of the two small square semiconductor diodes D1' are connected in series to the underside of rectangular semiconductor diode D1.

In that the two small square semiconductor diodes D1' face upward with particular underside US, the two undersides US of small square semiconductor diodes D1' have covering ABS.

In the further progression, the two undersides US of the two small square semiconductor diodes D1 are connected to second contact surface KF2 of a fourth connector VB4. Fourth connector VB4 has an identical geometric shape as the two connectors VB1, VB2.

Figure 7:
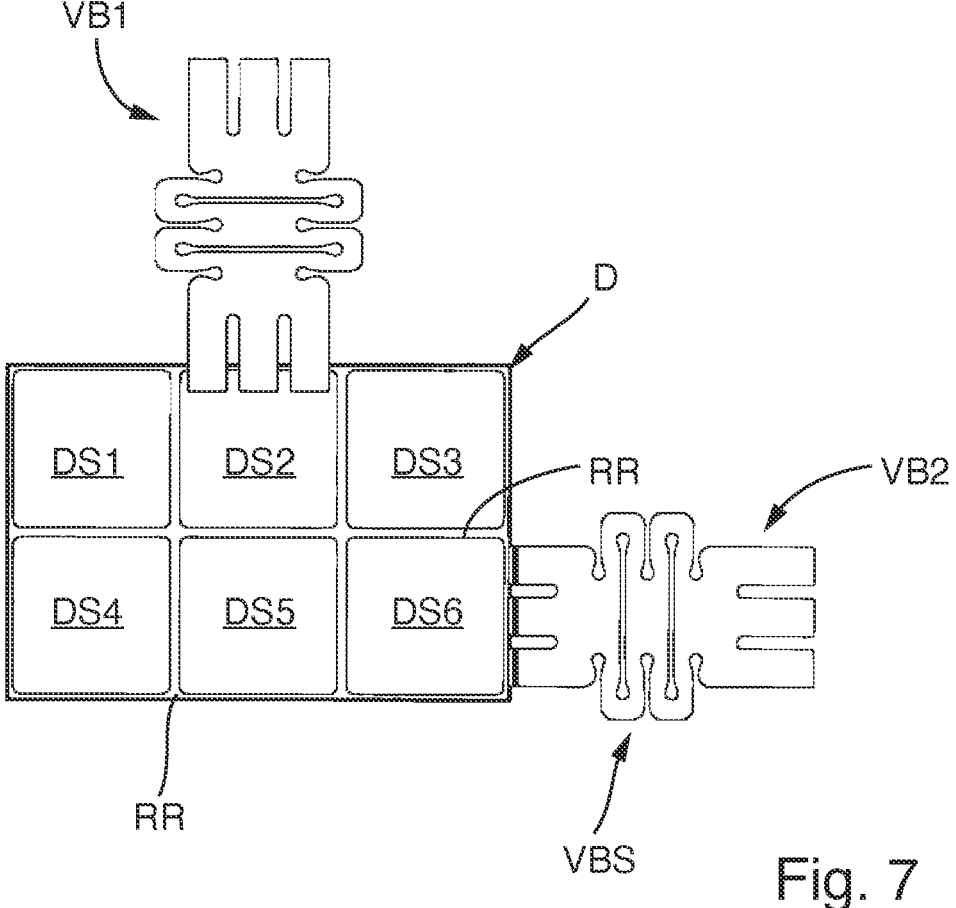
FIG. 7 shows a front view of a diode arrangement, comprising multiple diodes isolated from each other on the front side by mesa trenches.

A top view of die D is shown in the illustration in FIG. 7. In contrast to the preceding examples, die D now comprises multiple diodes DS1 through DS6, which are electrically separated with the aid of scribe line RR.

The total of six diodes DS1 through DS6 are arranged in two rows, die D having a rectangular shape.

Underside US is not illustrated. However, underside US is metal-plated over its entire surface and contacted with the aid of connector VB2. A diode DS2 is contacted on the upper side with the aid of a connector VB1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

What is claimed is:

1. A diode arrangement as an uncased finished product, the arrangement comprising:
   a semiconductor diode having exactly one p/n junction, the semiconductor diode having a p-doped upper side and an n-doped underside or an n-doped upper side and a p-doped underside;
   a first electrical contact being formed on the upper side;
   a second electrical contact being formed on the underside;
   wherein the uncased semiconductor diode is designed as a discrete component and as a flat die;
   wherein the semiconductor diode has a planar upper side and a planar underside;
   wherein the surface area of the upper side and the surface area of the underside are completely or at least up to 90% metal-plated, and the metal-plated upper side forms the first contact of the semiconductor diode, and the metal-plated underside forms the second contact thereof;
   wherein a first flat metallic connector is formed with a first contact surface and a second contact surface, which is spaced a distance apart from the first contact surface by a connecting piece;
   wherein a second flat metallic connector is formed with a first contact surface and a second contact surface which is spaced a distance apart from the first contact surface by a connecting piece;
   wherein the particular connecting piece in the two connectors does not project, or projects no more than 1.5 mm, from a plane determined by the first contact surface or by the second contact surface;
   wherein the metal-plated upper side is connected in a materially bonded manner to one of the two contact surfaces of the first metallic connector; and
   wherein the metal-plated underside is connected in a materially bonded manner to one of the two contact surfaces of the second metallic connector.

2. The diode arrangement according to claim 1, wherein the upper side includes exactly one first contact.

3. The diode arrangement according to claim 1, wherein the underside includes exactly one single second contact irrespective of the size of the die.

4. The diode arrangement according to claim 1, wherein multiple first contacts arranged side by side are formed on the upper side, and wherein two directly adjacent first contacts are electrically isolated from each other in each case with the aid of a mesa trench.

5. The diode arrangement according to claim 1, wherein exactly two first contacts are electrically connected to a single connector.

6. The diode arrangement according to claim 1, wherein a cover glass is arranged on the upper side or on the underside, wherein a layer of adhesive is arranged between the cover glass and the contact surface.

7. The diode arrangement according to claim 6, wherein the adhesive and the cover glass are transparent in a visible spectral range and in an ultraviolet spectral range.

8. The diode arrangement according to claim 1, wherein the connecting piece between the first contact surface and the second contact surface comprises meander-shaped metal strips or is made up of meander-shaped metal strips.

9. The diode arrangement according to claim 1, wherein the first contact surface and/or the second contact surface is/are at least partially provided with a fork-shaped design and has/have exactly one lug piece or exactly two lug pieces or at least or exactly three lug pieces, and the multiple lug pieces are designed to be spaced a distance apart and in parallel to each other.

10. The diode arrangement according to claim 1, wherein the first contact surface of the first connector simultaneously contacts two semiconductor diodes situated side by side.

11. The diode arrangement according to claim 1, wherein the arrangement of connectors and the semiconductor diode has a thickness between 0.03 mm and 1.5 mm or between 0.1 mm and 0.5 mm.

12. The diode arrangement according to claim 1, wherein the semiconductor diode is covered on the upper side or on the underside, and wherein the portion of the contact surface arranged on the upper side or the underside is covered.

13. The diode arrangement according to claim 1, wherein the connectors and the semiconductor diode are arranged in a plane or approximately in a plane.

14. The diode arrangement according to claim 1, wherein an offset is formed in the connectors between one of the two contact surfaces and the connecting piece, and the offset corresponds in a first approximation to the thickness of the semiconductor diode.

15. The diode arrangement according to claim 1, wherein the semiconductor diode is designed as a silicon diode.

\* \* \* \* \*